US008289332B2

(12) United States Patent
Dokken et al.

(10) Patent No.: US 8,289,332 B2
(45) Date of Patent: Oct. 16, 2012

(54) APPARATUS AND METHOD FOR DETERMINING INTERSECTIONS

(75) Inventors: Tor Dokken, Oslo (NO); Vibeke Skytt, Haslum (NO); Trond Runar Hagen, Oslo (NO); Jens Olav Nygaard, Oslo (NO)

(73) Assignee: Sinvent AS, Trondheim (NO)

( * ) Notice: Subject to any disclaimer, the term of this patent is extended or adjusted under 35 U.S.C. 154(b) by 1051 days.

(21) Appl. No.: 11/793,363

(22) PCT Filed: Dec. 8, 2005

(86) PCT No.: PCT/NO2005/000453
§ 371 (c)(1),
(2), (4) Date: Apr. 28, 2008

(87) PCT Pub. No.: WO2006/135243
PCT Pub. Date: Dec. 21, 2006

(65) Prior Publication Data
US 2008/0259078 A1    Oct. 23, 2008

(30) Foreign Application Priority Data

Dec. 21, 2004  (NO) .................................... 20045586

(51) Int. Cl.
*G06F 15/16*    (2006.01)
*G06T 1/00*    (2006.01)
*G06T 15/00*    (2011.01)

(52) U.S. Cl. ......... 345/502; 345/503; 345/504; 345/522

(58) Field of Classification Search .......... 345/502–504, 345/522, 629, 423
See application file for complete search history.

(56) References Cited

U.S. PATENT DOCUMENTS
4,890,242 A    12/1989  Sinha et al.
(Continued)

FOREIGN PATENT DOCUMENTS
EP    0 806 743    11/1997

OTHER PUBLICATIONS

Adamson, A., et al. "Adaptive Sampling of Intersectable Models Exploiting Image and Object-space Coherence." Proceedings of the Symposium on Interactive 3D Graphics, Washington, DC, U.S. (2005) pp. 171-178.

(Continued)

*Primary Examiner* — David T Welch
(74) *Attorney, Agent, or Firm* — Ladas & Parry LLP

(57) ABSTRACT

In a data processing system for determining intersections between geometric objects, the work is split between a CPU and a stream processor. The intersection determination is controlled by the CPU. Data processing intensive parts of intersection algorithms, such as checking possible overlap of objects, checking overlap of normal fields of objects, approximating the extent of an object, approximating the normal fields of an object, or making conjectures for intersection topology and/or geometry between objects, are run on the stream processor. The results of the algorithmic parts run on the stream processor are used by the part of the algorithms run on the CPU. In cases where conjectures for the computational result are processed on the stream processor, the conjectures are checked for correctness by algorithms run on the CPU. If the correctness check shows that the result found is incomplete or wrong, additional parts of the algorithm are run on the CPU and possibly on the stream processor.

17 Claims, 4 Drawing Sheets

Figure 1:
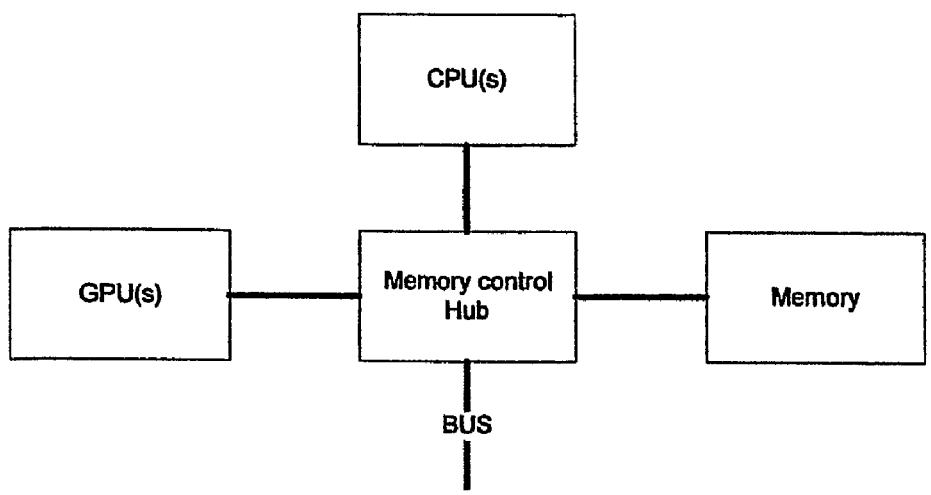

Typical architecture integrating one or more CPUs and one or more GPUs

U.S. PATENT DOCUMENTS

| | | | |
|---|---|---|---|
| 5,444,838 A * | 8/1995 | Kommrusch et al. | 345/441 |
| 5,497,453 A | 3/1996 | Megahed et al. | |
| 5,574,835 A * | 11/1996 | Duluk et al. | 345/421 |
| 6,283,861 B1 * | 9/2001 | Kawai et al. | 463/43 |
| 6,577,305 B1 * | 6/2003 | Duluk et al. | 345/419 |
| 7,126,605 B1 * | 10/2006 | Munshi et al. | 345/428 |
| 7,212,207 B2 * | 5/2007 | Green et al. | 345/426 |
| 7,868,891 B2 * | 1/2011 | Wexler et al. | 345/503 |
| 2002/0163515 A1 * | 11/2002 | Sowizral et al. | 345/419 |
| 2002/0167513 A1 * | 11/2002 | Baraff et al. | 345/420 |
| 2003/0112281 A1 * | 6/2003 | Sriram et al. | 345/958 |
| 2004/0002380 A1 * | 1/2004 | Brosnan et al. | 463/32 |
| 2005/0146522 A1 * | 7/2005 | Maillot | 345/423 |
| 2005/0231514 A1 | 10/2005 | Harper et al. | |
| 2006/0059494 A1 * | 3/2006 | Wexler et al. | 718/105 |
| 2006/0176302 A1 * | 8/2006 | Hayes et al. | 345/426 |
| 2006/0209061 A1 * | 9/2006 | Burch et al. | 345/419 |

OTHER PUBLICATIONS

Supplementary European Search Report dated Apr. 7, 2010 for corresponding application EP05858009.3.

Govindaraju, Naga K., et al: "Fast and Reliable Collision Culling using Graphics Hardware", Proceedings of the ACM Symposium on Virtual Reality Software and Technology, p. 2-9, Nov. 10, 2004.

Lin, Ming C., "Accelerated Queries and Physical Simulation Using Graphics Processors", Computer Graphics and Applications, p. 37-39, Oct. 6-8, 2004.

* cited by examiner

Typical architecture integrating one or more CPUs and one or more GPUs

APPARATUS AND METHOD FOR DETERMINING INTERSECTIONS

FIELD OF THE INVENTION

The invention relates generally to a computer apparatus and a data processing method and apparatus in which the intersections between two or more geometric objects, as well as self-intersections in one geometric object, are determined. More particularly, the invention relates to a computer apparatus and a data processing method which may be employed with advantage in computer aided design, computer aided manufacturing, rapid prototyping, finite element pre-processing, computer animation and other applications where correct intersections between geometric objects are to be determined rapidly.

In this text, the phrase "intersections for geometric objects" is defined as comprising as well "intersections between two or more geometric objects" as "self-intersections in one and the same geometric object". Further, the phrase "tessellated representation" is defined as comprising both the mathematically defined "tessellated representation" and "triangulation representation", and the phrase "tessellation" is defined as comprising both the mathematically defined "tesselation" and "general triangulations".

DESCRIPTION OF RELATED ART

Within CAD (Computer-Aided Design) and other product development oriented applications it is a common practice in prior art to use only programs executed on the CPU (Central Processor Unit) to calculate intersections between geometric objects. A number of approaches exist that give more or less guarantee of the quality of the intersection calculated. However, for collision culling in graphics applications the use of GPUs (Graphics Processor Unit) is proposed in "*Fast Collision Culling using Graphics Processors*, UNC-CH Technical Report, January 2004" by Naga Govindaraju, Ming C. Lin and Dinesh Manocha.

Although the innovation is not limited to CAD, we will describe the mathematics behind the innovation in CAD-related terms. In CAD the surfaces can be Parametric surfaces. A surface $p(s,t)$, $(s,t) \in \Omega \subset R^2$ is described as a mapping from a closed and bounded set $\Omega \in R^2$ to $R^3$. The surface is piecewise polynomial, i.e. it is built by a patchwork of rational pieces (minimum is one piece) that meet with tangent, curvature or higher order continuity. The standardized representation format for rational piecewise polynomials within CAD is NURBS—NonUniform Rational B-splines.

Low degree algebraic surfaces such as the plane (degree 1), conics (degree 2) and the torus (degree 4). The algebraic surfaces are described by an implicit polynomial equation $f(x, y, z)=0$, $(x, y, z) \in R^3$, of total degree 1, 2 or 4.

A great challenge within CAD is to make high quality models. In such models, fast high quality intersection calculations are necessary to enable efficient design of high quality CAD-models. While the intersection of two planar surfaces is simple to evaluate, the intersection of two NURBS surfaces $p(s,t)$, $(s,t) \in \Omega_1$. and $r(u,v)$, $(u,v) \in \Omega_2$ is a major challenge.

As an example, let both surfaces be bi-cubic, e.g. of degree 3 in both parametric variables. The intersection problem $p(s,t)=r(u,v)$ is the problem of solving 3 polynomial equations in four variables, with the polynomial degree in each variable being 3. Let us assume that we find the exact implicit representation $q(x,y,z)=0$ of a polynomial segment of the surface $r(u,v)$, $(u,v) \in \Omega_2$. When $r(u,v)$ is bicubic, this implicit equation has total degree 18. Combining the parametric representation of one surface with the exact implicit representation of the other surface $q(p(s,t),)=0$ reduces the number of unknowns to two. However, the resulting problem is now to find the zero set of a polynomial equation in two variables with polynomial degree in both variables being 54. Thus the intersection problem encountered in CAD is in general a very challenging problem.

Over the years, many approaches have been followed to calculate intersections between CAD-type surfaces. In general, the more computations you can afford, the higher the quality of the intersection will be. Stream processors offer high computational performance. Graphics cards (GPUs) have a stream processor type architecture. The rapid growth in the computational performance of graphics cards experienced from 2003 opens up the possibility to use these as a computational resource in intersection algorithms. A graphics card used as a stream processor in intersection calculations offers high volume computations with a low cost. Thus, combining one or more CPUs and one or more GPUs in intersection calculations has the potential to significantly increase the available computational power, and thus the quality of intersection calculations.

The publication "The Ray Engine", Graphics Hardware 2002, Sep. 1-2. 2002, Saarbrücken, Germany, The Eurographics Association, 2002, by Nathan A. Carr et al, discloses a computer system for estimating intersections between rays and triangles, to provide information regarding ray intersection points closest to the "camera" from which the rays emanate. A cooperation between GPU and CPU is described, however the GPU provides only such intersection points as just mentioned, and is not able to provide more complex topology information.

The simplest approach for the intersection of geometric objects is to approximate both surfaces with triangulations and intersect these triangulations. Another fairly simple approach is lattice evaluation where a lattice of curves is calculated over both surfaces and the lattice of curves from each surface is intersected with the other surface. The points identified can be used for tracing out intersection curves on which the points lie. For both these methods, the intersection calculated is a conjecture of the actual intersection, not a proved calculation.

For certain classes of low degree algebraic representations, explicit representations of the intersection topology and geometry exist. However, for the intersection of general algebraic or parametric surfaces, no such explicit representations exist.

Homotophy continuation is an approach where a known problem is solved and then the problem is modified gradually to a more complex problem. During the modification the solution is monitored. Intersection algorithms exist based on this approach.

Recursive methods use a divide and conquer strategy. If the problem is too complex for determining the topology of the intersection, the problem is split into sub-problems, the idea being that the sub-problems are simpler to solve than the original problem. However, in this approach care must be taken to ensure that the sub-problems are simpler. If care is not taken a problem can become more complex after subdivision. The subdivision approach can ensure that all intersections are found within specified tolerances when run on a normal CPU. However, recursive methods are computationally expensive.

Marching methods are used in surface/surface intersections. It is a method where we start from a point on the solution and then search for new points on the intersection close to the current point. When singular points are reached, points where the surface normal vanishes, problems occur when deciding how to continue the search. Marching methods can use start points generated e.g. by lattice evaluation or recursive subdivision. A marching method has no guarantee that the complete intersection configuration is found.

Bi-section methods are closely related to marching methods. In the case of a bi-section method two or more points on an intersection curve are given, and new points are calculated in between. The process can be repeated until all curve segments are a satisfactory approximation of the true intersection curves. If two adjacent points do not belong to the same intersection curve branch, the bisection will not converge. Detecting the lack of convergence can be used for detecting when a conjecture or proposed intersection curve is a misinterpretation of a situation with multiple intersection branches.

Within Computer Aided Design low quality calculation of intersections results in low quality CAD-models. Lattice evaluation methods are in general faster than recursive methods. However, lattice evaluation can not detect singular intersection points and might miss intersection branches. Recursive methods are slower since they search for a guaranteed solution within specified tolerance.

Accordingly there is a need for fast calculations of guaranteed intersection results.

SUMMARY OF INVENTION

Briefly, and in general terms, the present invention provides improvements in intersection calculations and apparatus whereby data processing speed can be increased substantially and the quality guaranteed within specified tolerances.

More particularly, by way of example and not necessarily by way of limitation, the present invention provides an organization of the intersection process to be performed on at least one CPU initiating computational intensive tasks on at least one stream processor. In cases when the calculation results from the at least one stream processor creates a conjecture, the CPUs are used for evaluating the correctness of the calculation. In cases when the stream processors return verified information, the information can be used directly in the part of the intersection process controlled and executed on the CPUs and possibly also for launching new computation intensive tasks to be performed by the stream processors. In other words, the present innovation provides an intersection calculation process that provides the use of at least one CPU and at least one stream processor, using the computational power of the stream processors to perform computer intensive tasks such as generating a conjecture of the topology and geometry of the intersection, and then using this conjecture as a guide through a verification process. In case the conjecture is not valid within the tolerances specified, the information from the conjecture is used to guide the process of improving the conjecture and verifying that the result is valid within the tolerances specified. This improvement process can combine the use of the CPUs and the stream processors, and has possibly multiple repetitions. The approach also opens up the possibility to use the computational power of the stream processors to detect spatial separation of geometric objects or their normal sets, or to make verified approximations to the extent of the normal sets or the spatial extent.

Hence, the present invention satisfies a long existing need for enhanced intersection calculations at increased processing speed. The present invention clearly fulfils these needs.

Hence, in a first aspect of the present invention there is provided a computer apparatus for determining and finding a geometric representation of intersection topology for geometric objects that are described using any of parametric representation, algebraic representation and tessellated representation, the computer apparatus comprising at least one central processor unit (CPU) operative to perform portions of an intersection algorithm, initialize sub-algorithms thereof, control the sub-algorithms and to process a conjecture for an intersection calculation result, wherein the computer apparatus further comprises at least one stream processor unit (SPU) operative to receive subparts of the intersection algorithm from the at least one CPU and to execute the sub-algorithms of the intersection algorithm, resulting in information necessary to establish the conjecture, and to return the information to the at least one CPU.

Preferable and favourable embodiments of the computer apparatus of the present invention appear from the appended dependent claims 2-6.

In a second aspect of the present invention there is provided a method for determining and finding, in a computer apparatus comprising at least one central processor unit (CPU), a geometric representation of intersection topology for geometric objects that are described using any of parametric representation, algebraic representation and tessellated representation, the method comprising initializing, in the at least one CPU, sub-algorithms of an intersection algorithm, controlling, in the at least one CPU, the sub-algorithms of the intersection algorithm, executing, in the at least one CPU, the sub-algorithms of the intersection algorithm, and processing a conjecture for an intersection calculation result, wherein the method further comprises transmitting at least one of the sub-algorithms of the intersection algorithm to at least one stream processor unit (SPU) comprised by the computer apparatus, the at least one SPU executing sub-algorithms of the intersection algorithm, resulting in information necessary to establish the conjecture, and returning the information to the at least one CPU.

Preferable and favourable embodiments of the invention appear from the appended dependent claims.

These and other objectives and advantages of the invention will become apparent from the following more detailed description, when taken in conjunction with the accompanying drawings of illustrative embodiments.

SHORT DESCRIPTION OF THE DRAWINGS

Figure 2:
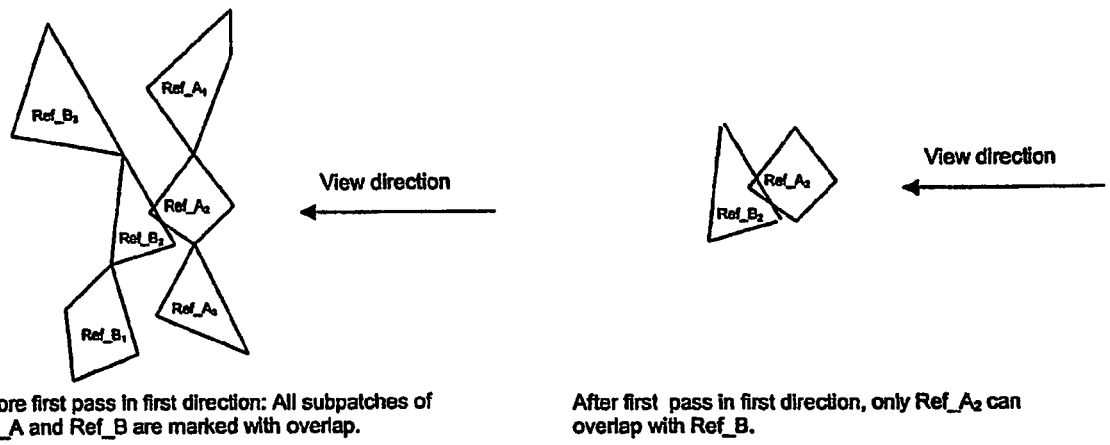
Figure 3:
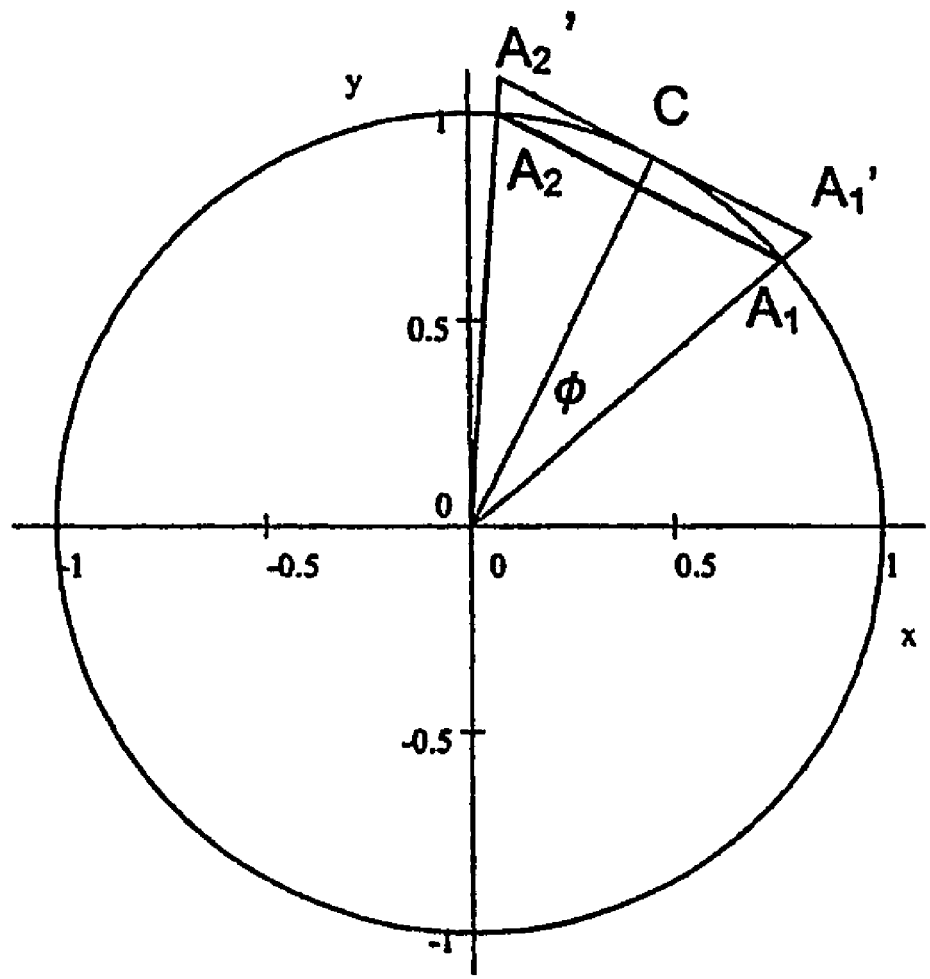
Figure 4:
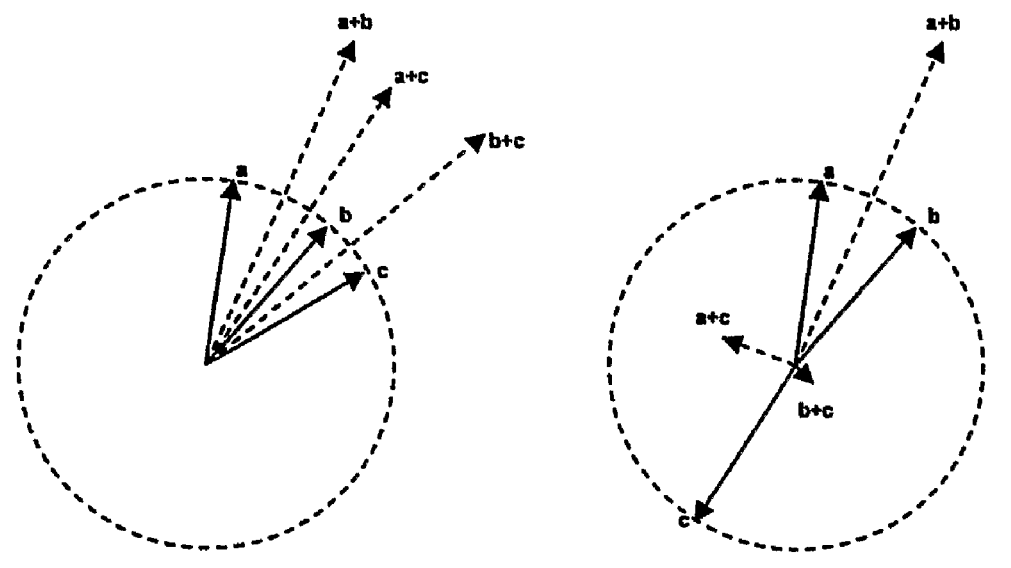

FIG. 1 shows a typical architecture of a computer apparatus in accordance with an embodiment of the present invention, FIG. 2 shows an example of occlusion testing for NURBS surfaces, FIG. 3 shows a 2-dimensional simplification of an extension for triangles to volumes, for finding the normal field of NURBS surfaces, and FIG. 4 shows examples of-comparisons of vector angles in self-intersection problems for NURBS surfaces.

DESCRIPTION OF THE PREFERRED EMBODIMENTS

One typical example of a prior art intersection algorithm is the division of the intersection calculation into a topology phase that detects points on candidate curves e.g. by lattice evaluation followed by a marching or bi-section of candidate curves.

Another example is a first step using recursive subdivision to detect the intersection topology, and a subsequent step refining the detected curves by either bi-section or marching.

The invention has two main components:

The structuring in the algorithm for intersection calculation into a process comprised of the steps:
1. Start the intersection calculation on the one or more CPUs
2. Use the one or more stream processors to calculate conjectures on the intersection curve geometry and/or topology.
3. Verify and correct the intersection conjecture possibly including a reiteration of the second step on a subpart of the original problem.

The execution of computation intensive parts of the intersection algorithm on one or more stream processors and the use of the computations from the one or more stream processors in the algorithm controlled and partly performed on one or more CPUs.

In the above described apparatus, among sub-processes that can run either on the one or more CPUs or one or more stream processors are:

Processing of geometric objects to extract information to be used for determining if two or more objects possibly overlap.

Processing of geometric objects to extract information to be used for determining if the normal vector fields of two geometric object possibly overlap.

Processing of geometric objects to calculate an approximation to the extent of an object, an approximation that is guaranteed to contain the extent of the geometric object.

Processing of geometric objects to calculate an approximation to the normal field extent of an object that is guaranteed to contain the normal field of the geometric object Tessellation of a geometric object Calculation of partial derivatives of a geometric object, either in points or as a closed expression, Calculation of normals of a geometric object, object, either in points or as a closed expression.

The preferred selection for implementation is a standard PC running e.g. Windows, Linux or other operating systems with one or more stream type processor, preferably GPU(s). However, the invention is aimed at any CPU and stream processor configuration on any operating system. Concerning GPUs, the preferred selection is currently one or more graphics cards with one or more GPUs. However, the idea is not limited to graphics cards. It should be noted that the one or more CPUs and the one or more stream processors can use different floating point precisions. The algorithms in the one or more CPUs will typically be using 64 bit floating point representation, while the algorithms on the one or more GPUs will typically use 32 bit floating point representation.

In FIG. 1 is a simplified view of a relevant architecture, where the one or more CPUs and one or more GPUs are connected to a high-speed bus, e.g. PCI Express. Alternatively, the GPU can be connected to an AGP-bus as is widely used in PC in 2004.

Example: Separation of Objects Using One or More GPUs, Example for NURBS surface We assume that two untrimmed NURBS surfaces are to be intersected. An example is the implementation of the intersection on the combination of one or more CPUs and one or more GPUs. The algorithm uses occlusion culling and a number of predefined viewing directions. In the occlusion testing one alternative is to use the convex hull of Bezier subpatches when performing the occlusion testing, another alternative is to use SLEVEs. The mathematics of SLEVEs can be found in "J. Peters, *Mid-structures of Subdividable Linear Efficient Function Enclosures Linking Curved and Linear Geometry*", in *Proceedings of SIAM conference*, Seattle, November 2003, Nashboro Press, 2004. Combinations of these two approaches can be used as well. In FIG. 2, left part, we see polygons before occlusion culling based on the first view direction. In the right part of the figure, we see the results of the occlusion culling.

Checking for Overlap of Two NURBS Surfaces (Surface_A and Surface_B)
1. For both Surface_A and Surface_B a knot insertion algorithm is initiated based on the Oslo Algorithm. For both surfaces discrete B-splines for converting the surfaces from a NURBS representation to a Bezier representation are evaluated.
2. Either the one or more CPUs or the fragment processors of the GPU combine the input information to convert the NURBS surfaces to grids of Bezier patches.
3. The fragment processor subdivide each Bezier patch a predefined number of times in both parameter directions to produce a control net for each surface lying close to the surface. Denote these refined surface nets Ref_A and Ref_B
4. All Bezier patches of Ref_A are initiated with tags: =not_treated and Bezier patches of Ref_B are initiated with tag:=not_treated.
5. For each predefined viewing direction
   a. For each not_treated Bezier patch $Ref\_A_i$ of Ref_A, use occlusion queries on the GPU to determine which not_treated Bezier patch $Ref\_B_j$ of Ref_B obscures the back faces of $Ref\_A_i$. If the back faces of $Ref\_A_i$ are not obscured, $Ref\_A_i$ is marked as treated.
   b. Any Bezier patch $Ref\_B_j$ in Ref_B that do not obscure any back faces of any untreated subpatch of Ref_A is marked as treated.
   c. For each not_treated Bezier patch $Ref\_B_j$ of Ref_B use occlusion queries on the GPU to determine which not_treated Bezier patch $Ref\_A_i$ of Ref_A obscures the back faces of $Ref\_B_j$. If the back faces of $Ref\_B_j$ are not obscured $Ref\_B_j$ is marked as treated.
   d. Any not treated Bezier patch $Ref\_A_i$ in Ref_A that do not obscure any back faces of any untreated subpatch of Ref_B is marked as treated.
   e. If all subatches of both Ref_A and Ref_B are treated, the surfaces A and B do not overlap.
6. Remember which subpatches of Ref_A overlap which subpatches of Ref_B Example Separation of Normal Fields of Two Surfaces on GPU, Example for NURBS Surfaces In this example we make the normal fields for both surfaces and represent these as rational Bezier patches. These Bezier patches can be subdivided to a required level of detail. For each such sub patch we will have control points that are projected to 3D and that can be displayed as a grid of points. Now given one such normal field Bezier sub patch Sub A from Surf_A, and similarly Sub_B from Surf_B. We want to compare all combinations of three control points from Sub_A with all combinations of three controls from Sub_B. It is not sufficient to just compare the triangles, thus we choose to extend the triangles to volumes. FIG. 3 shows a 2D simplification of the extension that is described in the following (only two unit vectors $A_1$, $A_2$).

In 3D the extension is as follows:

Given 3 unit vectors $A_1$, $A_2$, and $A_3$

Make C as the outward normal vector to the plane spanned
by $A_1$, $A_2$, and $A_3$
Assume that $A_1$, $A_2$, and $A_3$ are in order counter clockwise
around C.
Make new vertices $A_1'$, $A_2'$, and $A_3'$ by
$A_1'=A_1/(\cos \phi_1)=A_1/(C \cdot A_1)$
$A_2'=A_2/(\cos \phi_2)=A_2/(C \cdot A_2)$
$A_3'=A_3/(\cos \phi_3)=A_3/(C \cdot A_3)$
Note if the dot product is zero then the triangle spans an
angle equal to $\pi$, and overlap must take place.
Draw the triangles:
$A_1$, $A_3$, and $A_2$
$A_1'$, $A_2'$, and $A_3'$
The planar four sided regions defined by
$A_1$, $A_2$, $A_2'$ and $A_1'$
$A_2$, $A_3$, $A_3'$ and $A_2'$
$A_3$, $A_1$, $A_1'$ and $A_3'$
As we do not control the orientation of the normals of the
surfaces we must also draw the volume mirrored around
the origin
Draw the triangles:
$-A_1$, $-A_2$, and $-A_3$
$-A_1'$, $-A_3'$, and $-A_2'$
The planar four sided regions defined by
$-A_1$, $-A_1'$, $-A_2'$ and $-A_2$
$-A_2$, $-A_2'$, $-A_3'$ and $-A_3$
$-A_3$, $-A_3'$, $-A_1'$ and $-A_1$
The original volume and the mirrored version we call the
mirrored extended triangles.

We assume that two untrimmed NURBS surfaces are to be
tested for overlap of normals. An example of the implementation of the algorithm on the combination of at least one CPU and a GPU:

Checking for Overlap of Normal Fields Two B-Splines Surfaces (Surface_A and Surface_B)
1. For both Surface_A and Surface_B a knot insertion algorithm is initiated based on the Oslo Algorithm. For both surfaces discrete B-splines for converting the surfaces from a NURBS representation to a Bezier representation are evaluated.
2. The CPU or the fragment processor on the GPU combines the input information to convert the NURBS surface to a grid of (rational) Bezier patches.
3. The GPU makes the exact normal fields of each (rational) Bezier patch of both surfaces. The continued processing is performed on the Bezier patches representing the normal fields.
4. The GPU subdivided each normal field rational Bezier patch a predefined number of times in both parameter directions to produce a control net for each surface normal field lying close to the surface. Denote these refined normal fields surface nets Ref_A and Ref_B
5. All Bezier patches of Ref_A are initiated with tags:=not treated and Bezier patches of Ref_B are initiated with tag:=not treated.
6. For each predefined viewing directions
    a. For each not treated Bezier patch Ref_$A_i$ of Ref_A, use occlusion queries on the GPU to determine which not treated Bezier patch Ref_$B_j$ of Ref_B has mirrored extended triangles that obscures the back faces of the mirrored extended triangles of Ref_$A_i$. If the back faces of the mirrored extended triangles of Ref_$A_i$ are not obscured, Ref_$A_i$ is marked as treated.
    b. Any Bezier patch Ref_$B_j$ in Ref_$_B$ with the mirrored extended triangles that do not obscure the mirrored extended triangles of any back faces of any untreated subpatch of Ref_A is marked as treated.
    c. For each not treated Bezier patch Ref_$B_j$ of Ref_B use occlusion queries on the GPU to determine which not treated Bezier patch Ref_$A_i$ of Ref_A has mirrored extended triangles that obscure the back faces the mirrored extended triangles of Ref_$B_j$. If the back faces of Ref_$B_j$ are not obscured, Ref_$B_j$ is marked as treated.
    d. Any Bezier patch Ref_$A_i$ in Ref_A with the mirrored extended triangles that do not obscure the mirrored extended triangles of any back faces of any untreated subpatch of Ref_B is marked as treated.
    e. If all subpatches of both Ref_A and Ref_B are treated, the normal fields surfaces A and B do not overlap.
7. Remember which subpatches of Ref_A overlap which subpatches of Ref_B.

Example of Self-intersection for NURBS Surfaces

The normal field of a tangent continuous surface has to span an angle larger than $\pi$ for the surface to be able to turn back on itself and thus possibly self-intersect. The self-intersection can be of two types:

Self-intersection with vanishing normal vector. In these cases the self-intersection can be a closed loop within the surface. The two traces of the self-intersection curve meet in a point where the normal vanishes.

Self-intersection with non-vanishing normal. The two traces do not meet and will touch the boundary of the surface. In the case of non-vanishing normal, points on all self-intersection curves can be identified by finding the intersection of the surface boundary with the surface.

By dividing the NURBS surface into small subsurfaces and analyze the surface normal behaviour of the separate sub-surfaces and the normal behaviour of adjacent sub-surfaces, it is possible to identify cases with non-vanishing surface normals. For a NURBS-surface $p(u,v)$ a closed description can be generated for the surface normal by making the cross product $n(u,v)=p_u(u,v) \times p_v(u,v)$ of the two first order partial derivatives. It is straight forward to describe $n(u,v)$ as a NURBS surface. For $n(u,v)$ to vanish, either one of the vertices of $n(u,v)$ has to vanish or the vertices has to span an angle greater than or equal to $\pi$.

To compare if a set of at least three normalized vectors span an angle less than $\pi$, we can check if all possible sums of any selection of two vectors from the set span less than $\pi/2$. In FIG. 4 we illustrate this for 3 vectors in the plane. In the left part of FIG. 4 the three vectors span an angle less than $\pi$, and we see that the sum of any selection of two of these vectors span less than $\pi/2$. In the right part the 3 vectors span angle greater than $\pi$, and we see that the sum of any selection of two of these vectors span more than $\pi/2$.

To establish non-vanishing normal within a subpatch, the vertices of the normal field should span an angle less than $\pi$. To perform this test we:

First test if any vertex of the normal field has vanished
We normalize all non-vanishing vertices of the normal field surfaces.
We then check if the vertices of the normal field span an angle less than $\pi/2$, by making the scalar product of all selections of normalized vertices of the normal field, and check if all the scalar products are positive.
In the cases when the above scalar products are non-positive we check if they span less than $\pi$. Thus, first we make a set of vectors denoted A, consisting of all possible sums of the two vectors from the normalized set of vertices of the normal field. If the scalar product of all selections of two vectors from the set A is positive, then the normal field spans an angle less than $\pi$, and the normal field of the subpatch is non-vanishing.

To establish that normals of adjacent tangent continuous subpatches that are joined with continuous tangent plane span less than $\pi$, we use the fact that if both patches span less than $\pi/2$, then the composition of the two patches must span less than $\pi$. In the above test we identify patches that will span less than $\pi/2$.

Test for Possibility of Vanishing Normal in NURBS Surface
1. The Surface is initiated based on the Oslo Algorithm. The discrete B-splines for converting the surface from a NURBS representation to a Bezier representation is evaluated.
2. The CPUs or fragment processor of the GPU combine the input information to convert the NURBS surface to a grid of (rational) Bezier patches.
3. The fragment processor of the GPU makes the exact normal fields of each (rational) Bezier patch of both surfaces. The continued processing is performed on the Bezier patches representing the normal fields.
4. The fragment processor of the GPU subdivided the normal field rational Bezier patch a predefined number of times in both parameter directions to produce a control net for each surface normal field lying close to the surface. Denote this refined normal surface Ref_A.
5. Initiate a texture, Flag, similar in size to the number of Bezier patches in Ref_A. One pixel is allocated to each Bezier subpatch.
6. On the GPU for each subpatch $Ref\_A_i$ of Ref_A
   Initiate the pixel in Flag corresponding to $Ref\_A_i$ to 0.
   If any coefficient vector of $Ref\_A_i$ vanish set Flag to 2, and go to next subpatch. Normalize the coefficient vector lengths to 1.
   For all selections of two coefficients vectors C and D from $Ref\_A_i$, make the scalar product of C and D. If the scalar product is no positive set pixel in Flag to 1.
   If the Flag value is zero then the patch normals span less than $\pi/2$ and self-intersect of subpatch is impossible, continue to next subpatch.
   For all selections of two coefficients vectors C and D from $Ref\_A_i$, make a vector equal to C+D and store in a texture for vectors Vect.
   Make the scalar product of all selections of two Vectors from Vect, if the scalar product is none positive then a vanishing normal is possible, set pixel in Flag to 2 and continue with next subpatch.
7. For each subpatch we will have after the completion of this
   If Flag=0 then the normals of the subpatch span less than $\pi/2$. If two adjacent subpatches both have Flag=0 then they can only intersect along a shared boundary or a shared corner.
   If Flag=1 then the normals of the subpatch span less than $\pi$ but more than $\pi/2$. The subpatch might intersect an adjacent patch outside of the shared boundary, or a shared corner.
   If Flag=2 then the normals of the subpatch span more or equal to $\pi$, vanishing normal. Self-intersection within subpatch possible.
8. Remember which subpatches might have a vanishing normal and which adjacent sub-patches might intersect outside of the shared boundary.

Intersection of Boundary with Subpatch Strip Along the Boundary

In the case where no possibilities of vanishing normals have been identified all self-intersections must touch a surface boundary. Thus the self-intersections can be traced by analyzing the interaction between the surface boundary and the surface. One challenge in this setting is that when a boundary element is intersected with the patch itself we will get coincidence if care is not taken. To take care of this one approach is to split the problem into two problems:

Intersection of the boundary with the patch with a subpatch strip along the boundary removed from the patch. The subpatch strip should correspond to the subpatch strip used when determining the possibility of vanishing normal at the start of this example.

Intersection of the boundary with the subpatch strip. The Flag values of each subpatch strip along the boundary can guide us to the proper handling of the boundary intersection.

We use the same subdivision of the boundary as for the subpatch strip (given when making the Flag)

For all sub elements on the boundary
  For all subpatches along the boundary
    If subpatch same as sub boundary indicate intersection only if Flag=2
    If subpatch adjacent to sub patch the sub boundary belongs to indicate intersection Only if sum of Flags>0.
    If not subpatch and sub boundary not adjacent indicate indicate intersection only if boxes overlap.

The invention claimed is:
1. A method for determining and finding, in a computer apparatus comprising at least one central processor unit (CPU) and at least one stream processor unit (SPU), a geometric representation of intersection topology for geometric objects that are described using any of parametric representation, algebraic representation, and tessellated representation, said method comprising
  initializing, in said at least one CPU, sub-algorithms of an intersection algorithm,
  controlling, in said at least one CPU, the sub-algorithms of said intersection algorithm,
  executing, in said at least one CPU, the sub-algorithms of said intersection algorithm,
  processing a conjecture for an intersection calculation result,
  wherein said method further comprises:
  transmitting at least one of said sub-algorithms of said intersection algorithm to at least one stream processor unit (SPU) comprised by said computer apparatus,
  said at least one SPU executing sub-algorithms of said intersection algorithm, resulting in information necessary to establish said conjecture, and
  returning said information to said at least one CPU,
  wherein intersections between at least two geometric objects are determined, and
wherein said at least one SPU executes at least one of the following sub-processes:
  processing of geometric objects to extract information to be used for determining whether two or more objects overlap,
  processing of geometric objects to extract information to be used for determining whether specified subparts of the objects overlap,
  processing of geometric objects to extract information to be used for determining whether normal vector fields of two geometric objects overlap,
  processing of geometric objects to extract information to be used for determining whether normal vector fields of specified subparts of the objects overlap,
  processing of geometric objects to calculate a hull that is guaranteed to contain the hull of a geometric object, processing of geometric objects to calculate a convex hull that is guaranteed to contain the convex hull of a geometric object, processing of geometric objects to calculate a hull that is guaranteed to contain the normal field of a geometric object, processing of geometric objects to calculate a convex hull that is guaranteed to contain the normal field of a geometric object, tessellation of a geometric object, calculation of partial derivatives of a geometric object, in points, calculation of partial derivatives of a geometric object, as a closed expression, calculation of normals of a geometric object, in points, calculation of normals of a geometric object, as a closed expression;

wherein the task of determining intersections is shared between said at least one CPU and said at least one SPU in the following manner:

said at least one CPU initiates the intersection determination process, said at least one SPU processes the geometric objects to extract information to determine whether object hulls overlap, said at least one CPU uses said information from said at least one SPU to report if an intersection is possible or not, and further comprising the following process steps:

if an intersection is possible, the geometric objects are tessellated on any of said at least one CPU and said at least one SPU, said at least one SPU calculates the intersections of the tessellated objects, also returning parameter tuples, said at least one CPU processes the intersections calculated by said at least one SPU and returns said calculated intersections as a conjecture for the complete intersection.

2. The method of claim 1, wherein said at least one SPU establishes said conjecture and returns said conjecture to said at least one CPU.

3. The method of claim 1, wherein said at least one CPU further verifies, if required by a geometry processing system, completeness and correctness of said conjecture.

4. The method of claim 1, wherein for tessellations representing parametric objects, the vertices of the tessellation are assigned a parameter tuple corresponding to a point location in the geometric object being tessellated.

5. The method of claim 1, further comprising the following step:

said at least one CPU processes the intersection conjecture to determine if the conjecture is topologically correct and within user specified tolerances, by using the conjecture as a guide in a subdivision type verification process.

6. The method of claim 5, wherein the processing of the intersection conjecture is implemented in any one of the following manners, depending on the needs of the user:

returning a simple yes/no/undetermined indication to a correctness question, providing an indication of the problematic areas, providing a correction of the intersection conjecture that satisfies user requirements.

7. The method of claim 1, wherein self-intersections in geometric objects are determined, and wherein said at least one SPU executes at least one of the following sub-processes:

processing of a geometric object to extract information to be used for determining whether the convex hulls of non-adjacent subparts of said object overlap, processing of a geometric object or a subpart thereof to extract information to be used for determining whether a normal vector field spans an angle less than or equal to $\pi$, processing of a geometric object or a subpart thereof to extract information to be used to determine an angle spanned by the normal vector field, processing of a geometric object to calculate a convex hull that is guaranteed to contain the convex hull of said geometric object or subparts thereof, processing of a geometric object to calculate a convex hull that is guaranteed to contain the normal vector field of said geometric object or subparts thereof, tessellation of a geometric object, calculation of partial derivatives of a geometric object, in points, calculation of partial derivatives of a geometric object, as a closed expression, calculation of normals of a geometric object, in points, calculation of normals of a geometric object, as a closed expression.

8. The method of claim 7, wherein the determination task is shared between said at least one CPU and said at least one SPU in the following manner:

said at least one CPU initiates the intersection determination process, said at least one SPU processes the geometric object to extract information to determine span of the object normal vector field, said at least one CPU uses said information from said at least one SPU to report if a self-intersection is possible or not.

9. The method of claim 8, further comprising the following process steps:

if a self-intersection is possible, the geometric object is tessellated on any one of said at least one CPU and said at least one SPU, said at least one SPU calculates the self-intersections of the tessellated objects, also returning parameter tuples if these are available, and said at least one CPU processes the self-intersections calculated by said at least one SPU, and returns this as a conjecture for the complete intersection.

10. The method of claim 9, wherein, for tessellations representing parametric objects, the vertices of the tessellation are assigned the parameter tuple corresponding to a point location in the geometric object being tessellated.

11. The method of claim 9, further comprising the following steps:

said at least one CPU processes the intersection conjecture provided by said at least one SPU to determine if it is topologically correct and within user specified tolerances, by using the conjecture as a guide in a subdivision type verification process.

12. The method of claim 11, wherein the processing of the intersection conjecture is implemented in any one of the following manners, dependent on the needs of the user:

returning a simple yes/no/undetermined indication to a correctness question, providing an indication of the problematic areas, providing a correction of the self-intersection conjecture that satisfies user requirements.

13. A method for determining and finding, in a computer apparatus comprising at least one central processor unit (CPU) and at least one stream processor unit (SPU), a geometric representation of intersection topology for geometric surfaces objects that are described using any of parametric representation, algebraic representation and tessellated representation, said method comprising

- initializing, in said at least one CPU, sub-algorithms of an intersection algorithm,
- controlling, in said at least one CPU, the sub-algorithms of said intersection algorithm,
- executing, in said at least one CPU, the sub-algorithms of said intersection algorithm, and
- processing a conjecture for an intersection calculation result, wherein said method further comprises

- transmitting at least one of said sub-algorithms of said intersection algorithm to at least one stream processor unit (SPU) comprised by said computer apparatus,
- said at least one SPU executing sub-algorithms of said intersection algorithm, resulting in information necessary to establish said conjecture, and
- returning said information to said at least one CPU;

wherein for calculating the intersection of two geometric objects, the task is shared between said at least one CPU and said at least one SPU in the following manner:

- said at least one CPU initiates the intersection calculation,
- said at least one SPU processes the geometric object to extract information to determine if convex object hulls overlap,
- if the geometric objects have a possible intersection, said at least one CPU or said at least one SPU extracts information to be used for determining whether normal vector fields of the two geometric objects overlap,
- if the normal vector field overlap, it is reported that a correct intersection has not been identified,
- if the convex hulls of normal vector fields do not overlap, meaning that all intersections touch the boundary of one of the geometric objects, then the boundaries of each object are intersected with an other object on any of said at least one CPU and said at least one SPU, and
- the resulting intersection points are reported as representing all intersections.

14. The method of claim 13, further comprising any one of the following process steps:

- using marching to connect corresponding boundary points while taking care of user specified accuracy regarding the intersection representation,
- using bi-section to connect corresponding boundary points while taking care of user specified accuracy of the intersection representation.

15. The method of claim 13, wherein specified functionality is replaced in the following manner if the normal vector fields overlap:

- if an intersection is possible, the geometric objects are tessellated on any of said at least one CPU and said at least one SPU,
- said at least one SPU calculates an intersection conjecture based on the tessellated objects, and if parameter tuples are available in the tessellations, this information is utilized to provide parameter tuples for the intersection structure provided,
- said at least one CPU processes said intersection conjecture provided by said at least one SPU to determine if it is topologically correct and within user specified tolerances, by using said conjecture as a guide in a subdivision type verification process.

16. The method of claim 15, wherein, for tessellations representing parametric objects, the vertices of the tessellations are assigned the parameter tuple corresponding to a point location in the geometric object being tessellated.

17. The method of claim 15, wherein the CPU processing of the intersection conjecture is implemented in any one of the following ways, dependent on the needs of the user:

- returning a simple yes/no/undetermined indication to a correctness question,
- providing an indication of problematic areas,
- providing a correction of the intersection conjecture that satisfies user requirements.

* * * * *